United States Patent
Hsieh

(10) Patent No.: US 8,432,221 B1
(45) Date of Patent: Apr. 30, 2013

(54) SWITCHING AMPLIFYING METHOD AND SWITCHING AMPLIFIER

(76) Inventor: Wen-Hsiung Hsieh, Keelung (TW)

( * ) Notice: Subject to any disclaimer, the term of this patent is extended or adjusted under 35 U.S.C. 154(b) by 0 days.

(21) Appl. No.: 13/304,664

(22) Filed: Nov. 27, 2011

(51) Int. Cl.
*H03F 3/217* (2006.01)

(52) U.S. Cl.
USPC ........................................................ 330/251

(58) Field of Classification Search ............... 330/10, 330/207 A, 251
See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | McCorkle | |
| 5,781,067 A | 7/1998 | Tota | |
| 5,805,020 A | 9/1998 | Danz | |
| 5,949,282 A | 9/1999 | Nguyen | |
| 5,986,498 A | 11/1999 | Rodriguez | |
| 6,304,137 B1 * | 10/2001 | Pullen et al. | 330/251 |
| 6,356,151 B1 | 3/2002 | Nalbant | |
| 6,392,476 B1 | 5/2002 | Rodriguez | |
| 6,489,839 B2 | 12/2002 | Maaskant et al. | |
| 6,563,377 B2 | 5/2003 | Butler | |
| 6,778,012 B2 * | 8/2004 | Kirn | 330/251 |
| 6,794,932 B1 | 9/2004 | Butler | |
| 6,844,777 B2 | 1/2005 | Kitamura | |
| 6,922,101 B2 | 7/2005 | Bayko | |
| 7,030,694 B2 | 4/2006 | Jonkman | |
| 7,286,008 B2 | 10/2007 | Watts | |
| 7,307,474 B2 | 12/2007 | Nguyen | |
| 7,400,191 B2 | 7/2008 | Rodriguez | |
| 7,633,336 B2 | 12/2009 | Bean | |
| 7,705,672 B1 | 4/2010 | Rodriguez | |
| 7,816,985 B2 | 10/2010 | Attwood | |
| 7,952,426 B2 | 5/2011 | Mun | |
| 7,961,047 B2 | 6/2011 | Pillonnet | |
| 7,969,126 B2 | 6/2011 | Stanley | |
| 8,203,382 B2 * | 6/2012 | Maeda | 330/251 |
| 8,212,613 B1 * | 7/2012 | Hsieh | 330/251 |
| 8,228,118 B1 * | 7/2012 | Hsieh | 330/251 |
| 2002/0125941 A1 * | 9/2002 | Nguyen | 330/251 |

* cited by examiner

*Primary Examiner* — Khanh V Nguyen

(57) ABSTRACT

A switching amplifying method or a switching amplifier for obtaining one or more than one linearly amplified replicas of an input signal, is highly efficient, and does not have the disadvantage of "dead time" problem related to the class D amplifiers. Said switching amplifying method comprises the steps of: receiving and pulse modulating the input signal for getting a pulse modulated signal; switching a first pulsed voltage from a DC voltage supply unit according to the pulse modulated signal and switching on a first switchable free-wheeling diode means unit when the polarity of the input signal is positive; switching a second pulsed voltage from the DC voltage supply unit according to the pulse modulated signal and switching on a second switchable free-wheeling diode means unit when the polarity of the input signal is negative; filtering the first pulsed voltage, the second pulsed voltage for outputting an output signal.

20 Claims, 8 Drawing Sheets

SWITCHING AMPLIFYING METHOD AND SWITCHING AMPLIFIER

BACKGROUND OF THE INVENTION (1) Field of the Invention

This invention is related in general to a power amplifier, and more particularly, to a switching amplifier that can efficiently and linearly amplify an input signal having first and second polarities for obtaining one or more than one low-distortion output signals.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. Patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces one or more than one linearly amplified replicas of an input signal, is highly efficient, and does not have the "dead time" problem related to class D amplifiers.

One aspect of the present invention provides a method of obtaining an output signal which is a linearly amplified replica of an input signal having first and second polarities, comprising the steps of: receiving the input signal; pulse modulating the input signal for getting a pulse modulated signal having first and second polarities; switching a first switching unit for getting a first pulsed voltage from a direct current (DC) voltage supply unit according to the pulse modulated signal when the polarity of the pulse modulated signal is positive; keeping the energy transmission from the first pulsed voltage to the output signal during the switching off period of the first switching unit via switching on a first switchable free-wheeling diode means unit coupled to the first switching unit to provide proper current path for the energy transmission when the polarity of the pulse modulated signal is positive; switching a second switching unit for getting a second pulsed voltage from the direct current (DC) voltage supply unit according to the pulse modulated signal when the polarity of the pulse modulated signal is negative; keeping the energy transmission from the second pulsed voltage to the output signal during the switching off period of the second switching unit via switching on a second switchable free-wheeling diode means unit coupled to the second switching unit to provide proper current path for the energy transmission when the polarity of the pulse modulated signal is negative; filtering the first pulsed voltage, the second pulsed voltage for outputting the output signal Another aspect of the present invention, the method further comprising: isolating the direct current (DC) voltage supply unit and the output signal via a transformer and a switchable rectifier diode means unit coupled between the first switching unit, the second switching unit and the first switchable free-wheeling diode means unit, the second switchable free-wheeling diode means unit, wherein the transformer comprises a primary winding, a secondary winding unit comprising a secondary winding or two secondary windings, and means for resetting the flux in the core of the transformer to its rest value by transforming the energy of parasitic inductance from the transformer to the direct current (DC) voltage supply unit during the switching off period of the first switching unit, the second switching unit; the switchable rectifier diode means unit blocks current flow in the secondary winding unit during the switching off period of the first switching unit, the second switching unit; and the direct current (DC) voltage supply unit comprises a positive direct current (DC) voltage rail.

Yet another aspect of the present invention provides a switching amplifier further comprising one or more than one slave outputs.

Yet another aspect of the present invention provides a switching amplifier further comprising a negative feedback signal generator to generate a negative feedback signal corresponding to the output signal, wherein the amplifier control unit integrates the input signal and the negative feedback signal to process a negative feedback control.

Yet another aspect of the present invention provides a switching amplifier further comprising a rectifying and smoothing unit to rectify and smooth an alternating current (AC) voltage and to provide the direct current (DC) voltage.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
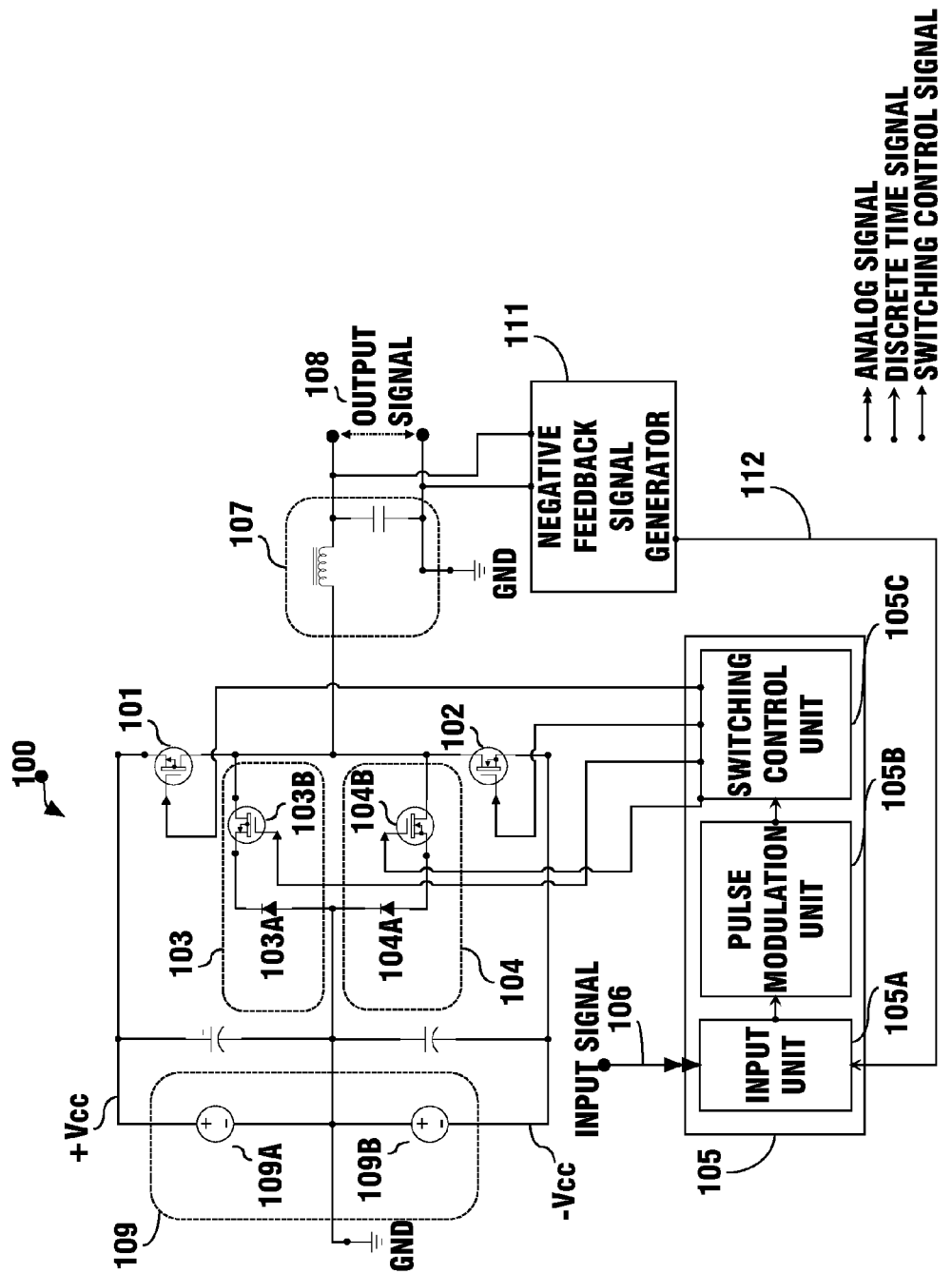
FIG. 1 is an exemplary block and circuit diagram illustrating a first embodiment of a switching amplifier in accordance with the present invention.

FIG. 1 is an exemplary block and circuit diagram illustrating a first embodiment of a switching amplifier 100 in accordance with the present invention.

As illustrated in FIG. 1, the switching amplifier 100 for obtaining an output signal 108 from a direct current (DC) voltage supply unit 109, wherein the output signal 108 is a linearly amplified replica of an input signal 106 having first and second polarities, said amplifier comprising: a first switching unit 101 comprising one switch for switching a first pulsed voltage from a positive direct current (DC) voltage rail 109A of the direct current (DC) voltage supply unit 109; a first switchable free-wheeling diode means unit 103 coupled to the first switching unit 101 comprising a free-wheeling diode means 103A and a switch 103B for providing a current path for transmitting energy from the first pulsed voltage to the output signal 108 during the switching off period of the first switching unit 101; a second switching unit 102 comprising a switch for switching a second pulsed voltage from a negative direct current (DC) voltage rail 109B of the direct current (DC) voltage supply unit 109; a second switchable free-wheeling diode means unit 104 coupled to the second switching unit 102 comprising a free-wheeling diode means 104A and a switch 104B for providing a current path for transmitting energy from the second pulsed voltage to the output signal 108 during the switching off period of the second switching unit 102; an amplifier control unit 105 for receiving the input signal 106 and coupled to the switches of the first switching unit 101, the second switching unit 102, the first switchable free-wheeling diode means unit 103 and the second switchable free-wheeling diode means unit 104 to control their switching according to the input signal 106; a filter unit 107 to obtain the output signal 108 corresponding to the input signal 106 by filtering the first pulsed voltage, the second pulsed voltage and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 1, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the first switching unit 101, the second switching unit 102, the switches 103B and 104B of the switchable free-wheeling diode means units 103, 104 to control their switching according to the pulse modulated signal from the pulse modulation unit 105B.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

Figure 2:
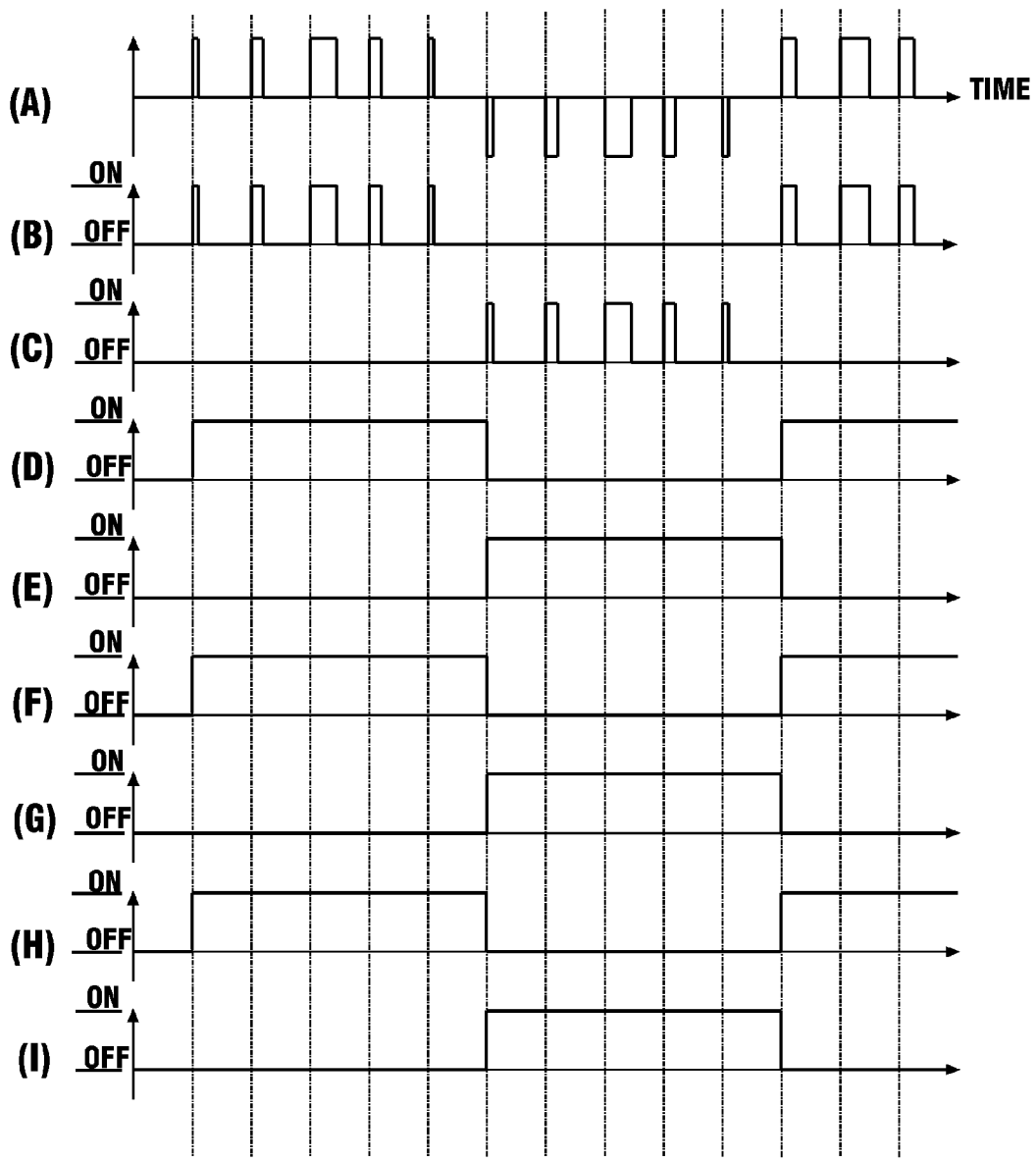
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), non-limiting exemplary waveforms of switching control signals from the switching control unit 105C to the switches 101 and 102 for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105C to the switches 103B and 104B are illustrated in FIG. 2(D) and FIG. 2(E), respectively.

Accordingly, as illustrated in FIG. 1 and FIG. 2, when the input signal 106 is zero, the switches 101, 102, 103B and 104B are all switched off.

When the input signal 106 is not zero and its polarity is positive therefore the polarity of the pulse modulated signal FIG. 2(A) is positive, the first switching unit 101 switches a first pulsed voltage from the positive direct current (DC) voltage rail 109A according to the pulse modulated signal pulse modulated from the input signal 106, and the switch 103B of the first switchable free-wheeling diode means unit 103 switches on to provide proper current path for a current flow through the inductor means of the filter 107 for keeping the energy transmission from the first pulsed voltage to the output signal 108 during the switching off period of the first switching unit 101.

When the input signal 106 is not zero and its polarity is negative therefore the polarity of the pulse modulated signal FIG. 2(A) is negative, the second switching unit 102 switches a second pulsed voltage from the negative direct current (DC) voltage rail 109B according to the pulse modulated signal pulse modulated from the input signal 106, and the switch 104B of the second switchable free-wheeling diode means unit 104 switches on to provide proper current path for a current flow through the inductor means of the filter 107 for keeping the energy transmission from the second pulsed voltage to the output signal 108 during the switching off period of the second switching unit 102.

As further illustrated in FIG. 1, the filter unit 107 is a low pass filter to obtain the output signal 108 corresponding to the input signal 106 by filtering the first pulsed voltage, the second pulsed voltage and outputting the output signal 108.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
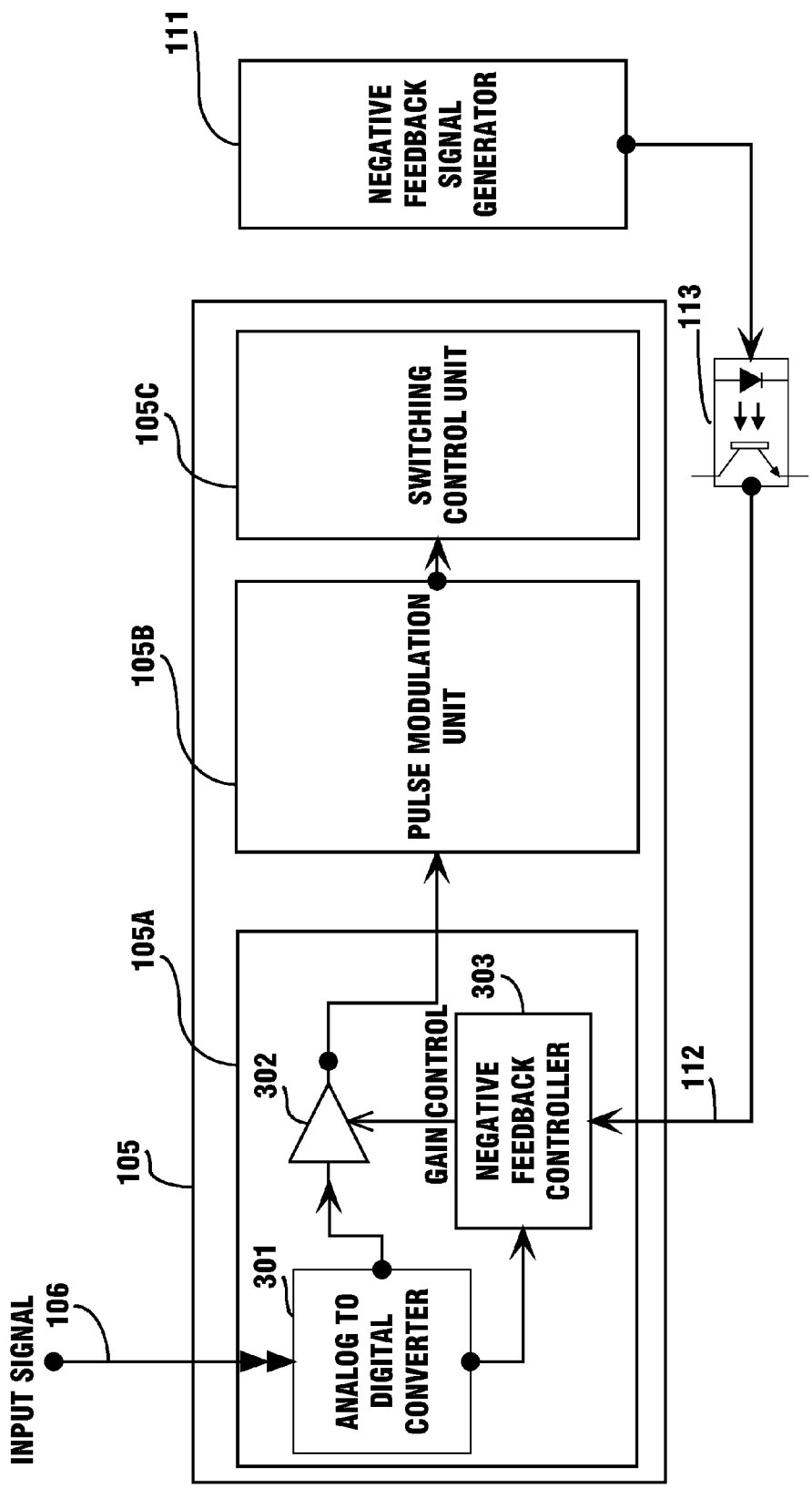
FIG. 3 is an exemplary block and circuit diagram illustrating an embodiment of the amplifier control unit integrating an input signal and a negative feedback signal in FIGS. 1, 4, 5, 6, 7 and 8 in accordance with the present invention.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n \leq \infty$$

to get a compensated discrete time input signal X [n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

Figure 4:
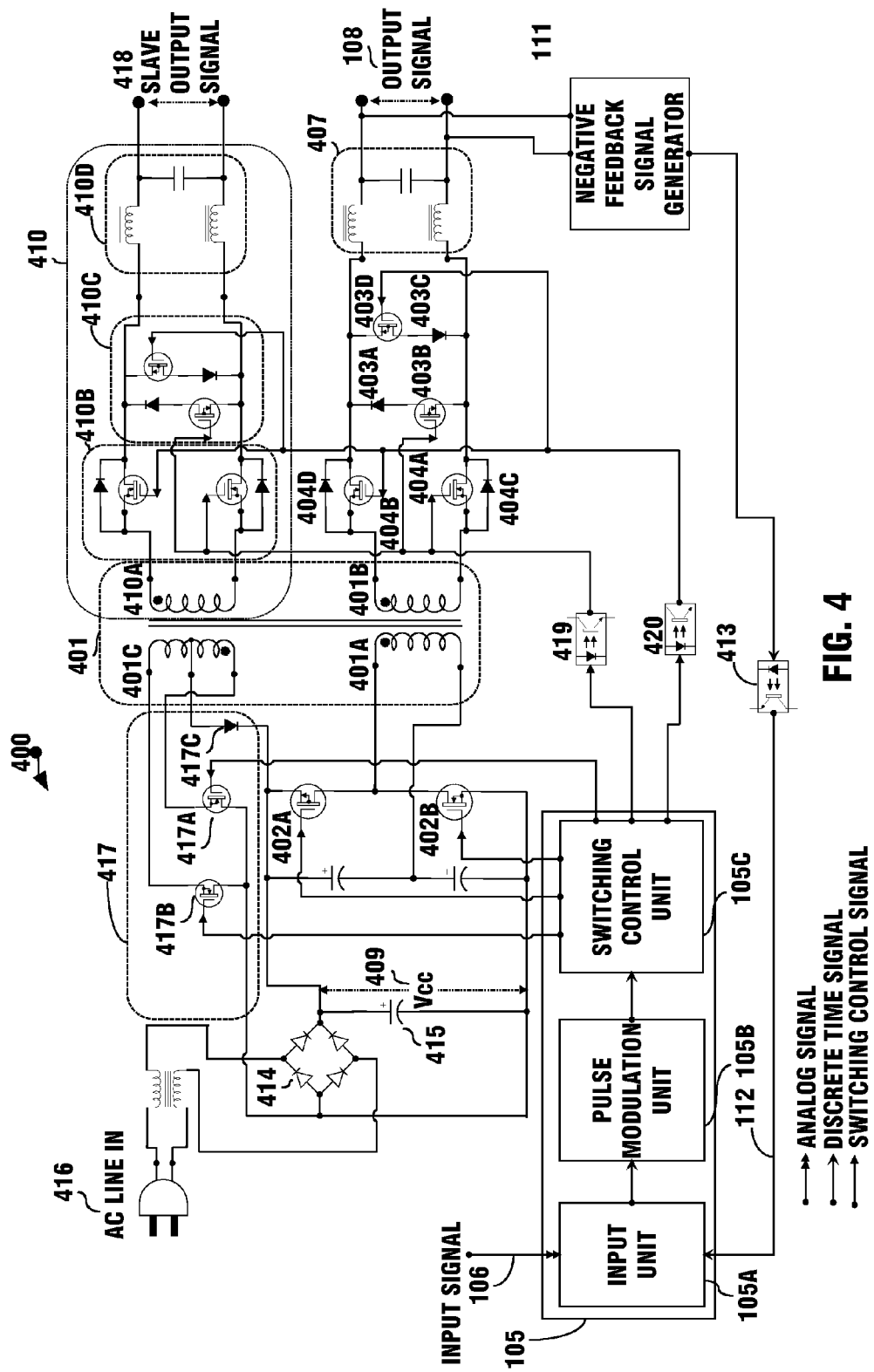
FIG. 4 is an exemplary block and circuit diagram illustrating a second embodiment of a switching amplifier in accordance with the present invention, wherein the first and second switching unit comprise a plurality of switches configured as a half bridge topology.

FIG. 4 is an exemplary block and circuit diagram illustrating a second embodiment of a switching amplifier 400 in accordance with the present invention, wherein the first and second switching unit 402A, 402B comprise a plurality of switches configured as a half bridge topology.

As illustrated in FIG. 4, the switching amplifier 400 for obtaining an output signal 108 from a direct current (DC) voltage supply unit comprising a direct current (DC) voltage rail 409, wherein the output signal 108 is a linearly amplified replica of an input signal 106 having first and second polarities, said amplifier 400 comprising: a first switching unit 402A comprising one switch for switching a first pulsed voltage from the direct current (DC) voltage rail 409; a first switchable free-wheeling diode means unit comprising a free-wheeling diode means 403A and a switch 403B for providing a current path for transmitting energy from the first pulsed voltage to the output signal 108 during the switching off period of the first switching unit 402A; a second switching unit 402B comprising one switch for switching a second pulsed voltage from the direct current (DC) voltage rail 409; a second switchable free-wheeling diode means unit comprising a free-wheeling diode means 403C and a switch 403D for providing a current path for transmitting energy from the second pulsed voltage to the output signal 108 during the switching off period of the second switching unit 402B; a transformer 401 comprising a primary winding 401A coupled to the first switching unit 402A and the second switching unit 402B; a secondary winding unit comprising a secondary winding 401B and means comprising a reset winding 401C, two reset switching means 417A, 417B and one diode 417C for resetting the flux in the core of the transformer to its rest value by transforming the energy of parasitic inductance from the transformer 401 to the direct current (DC) voltage supply unit 409 during the switching off period of the first and second switching unit 402A and 402B, wherein the transformer 401 is for isolating the direct current (DC) voltage rail 409 and the output signal 108, and further for stepping up or down the first and second pulsed voltage; a switchable rectifier diode means unit comprising two switches 404A, 404B and two diodes 404C, 404D coupled between the secondary winding 401B and the first switchable free-wheeling diode means unit 403A, 403B, the second switchable free-wheeling diode means unit 403C, 403D for blocking energy transmitted from the secondary winding 401B to the output signal during the switching off period of the first and second switching unit 402A, 402B; an amplifier control unit 105 for receiving the input signal 106 and coupled to the switches 402A, 402B, 403B, 403D, 404A, 404B, 417A, 417B to control their switching according to the input signal 106; a filter unit 407 to obtain the output signal 108 corresponding to the input signal 106 by filtering the first pulsed voltage, the second pulsed voltage and outputting the output signal.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 4, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the switches 402A, 402B, 403B, 403D, 404A, 404B, 417A, 417B to control their switching according to the pulse modulated signal from the pulse modulation unit 105B.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 4 and FIG. 2, a non-limiting exemplary waveform for the pulse modulated signal outputting from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signal from the switching control unit 105C to the switch 402A for controlling its switching is illustrated in FIG. 2(B); and a non-limiting exemplary waveform of switching control signal from the switching control unit 105C to the switch 402B for controlling its switching is illustrated in FIG. 2(C). Also according to the pulse modulated signal illustrated in FIG. 2(A), non-limiting exemplary waveforms of switching control signals from the switching control unit 105C to the switches 403B and 403D are illustrated in FIG. 2(D) and FIG. 2(E), respectively. Yet also according to the pulse modulated signal illustrated in FIG. 2(A), non-limiting exemplary waveforms of switching control signals from the switching control unit 105C to the switches 404A and 404B are illustrated in FIG. 2(F) and FIG. 2(G), respectively. Yet also according to the pulse modulated signal illustrated in FIG. 2(A), non-limiting exemplary waveforms of switching control signals from the switching control unit 105C to the switches 417A and 417B are illustrated in FIG. 2(H) and FIG. 2(I), respectively.

Accordingly, as illustrated in FIG. 4 and FIG. 2, when the input signal 106 is zero, the switches 402A, 402B, 403B, 403D, 404A, 404B, 417A, 417B are all switched off.

When the input signal 106 is not zero and its polarity is positive therefore the polarity of the pulse modulated signal FIG. 2(A) is positive, the first switching unit 402A switches a first pulsed voltage from the direct current (DC) voltage rail 409A according to the pulse modulated signal pulse modulated from the input signal 106, and the switch 403B of the first switchable free-wheeling diode means unit switches on to provide proper current path for a current flow through the inductor means of the filter 407 for keeping the energy transmission from the first pulsed voltage to the output signal 108 during the switching off period of the first switching unit 402A, and the switches 404A and 417A switch on for blocking a current flow in the secondary winding 401B to block energy transmitted from the secondary winding 401B to the output signal 108 during the switching off period of the first switching unit 402A and for resetting the flux in the core of the transformer 401 to its rest value by transforming the energy of parasitic inductance from the transformer 401 to the direct current (DC) voltage supply unit 409 during the switching off period of the first switching unit 402A.

When the input signal 106 is not zero and its polarity is negative therefore the polarity of the pulse modulated signal FIG. 2(A) is negative, the second switching unit 402B switches a second pulsed voltage from the direct current (DC) voltage rail 409A according to the pulse modulated signal pulse modulated from the input signal 106, and the switch 403D of the second switchable free-wheeling diode means unit switches on to provide proper current path for a current flow through the inductor means of the filter 407 for keeping the energy transmission from the second pulsed voltage to the output signal 108 during the switching off period of the second switching unit 402B, and the switches 404B and 417B switch on for blocking a current flow in the secondary winding 401B to block energy transmitted from the secondary winding 401B to the output signal 108 during the switching off period of the second switching unit 402B and for resetting the flux in the core of the transformer 401 to its rest value by transforming the energy of parasitic inductance from the transformer 401 to the direct current (DC) voltage supply unit 409 during the switching off period of the second switching unit 402B.

As further illustrated in FIG. 4, the filter unit 407 is a low pass filter to obtain the output signal 108 corresponding to the input signal 106 by filtering the first pulsed voltage, the second pulsed voltage and outputting the output signal 108.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 4, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n \leq \infty$$

to get a compensated discrete time input signal X[n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 4, the switching amplifier 400 further comprising one slave output unit 410 or more than one slave output units, although more than one slave output units are not shown in FIG. 4 but are obvious from said one slave output unit 410, wherein the slave output unit 410 comprises: the transformer 401 further comprising a slave secondary winding 410A; a switchable rectifier diode means unit 410B coupled to the slave secondary winding units for blocking energy transmitted from the slave secondary winding unit 410A to the slave output signal 418 during the switching off period of the first and second switching unit 402A, 402B; a first and second switchable free-wheeling diode means unit 410C for providing a current path for transmitting energy from the first and second pulsed voltage to the slave output signal 418 during the switching off period of the first and second switching unit 402A, 402B; a filter unit 410D to obtain the slave output signal 418 corresponding to the input signal 106 by filtering the pulsed voltage from the slave secondary winding unit 410A; wherein the amplifier control unit 105 further couples to the switches of slave output unit 410 to control their switching according to the input signal 105.

As further illustrated in FIG. 4, the amplifying gain of the output signal 108 is according to the turn ratio between the primary winding 401A and the secondary winding 401B; and the amplifying gain of the slave output signal 418 is according to the turn ratio between the primary winding 401A and the slave secondary winding 410A. Therefore, it is easy for the switching amplifier 400 to obtain a plurality of output signals with different amplifying gains.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 4, the amplifier control unit 105 of the switching amplifier 400 integrates the input signal 106 and the negative feedback signal 112 to process a negative feedback control. Accordingly, with the negative feedback control, the slave output signal 418 trends to track the output signal 108 for the direct current (DC) voltage 409 and load changes. Therefore, the switching amplifier 400 provides multiple output signals are substantially immune to power supply and load perturbations.

As further illustrated in FIG. 4, the switching amplifier 400 further comprises a photo coupler circuit 413 coupled between the negative feedback signal generator 111 and the amplifier control unit 105 to provide electric isolation between the negative feedback signal generator 111 and the amplifier control unit 105.

As further illustrated in FIG. 4, the switching amplifier 400 further comprises a photo coupler circuits 419, 420 coupled between the switchable free-wheeling diode means units, the switchable rectifier diode means units and the amplifier control unit 105 to provide electric isolation between the switchable free-wheeling diode means units, the switchable rectifier diode means units and the amplifier control unit.

As further illustrated in FIG. 4, the switching amplifier 400 further comprises a rectifying unit 414 and a smoothing unit 415 to rectify and smooth an alternating current (AC) voltage 416 and to provide the direct current (DC) voltage rail 409.

Figure 5:
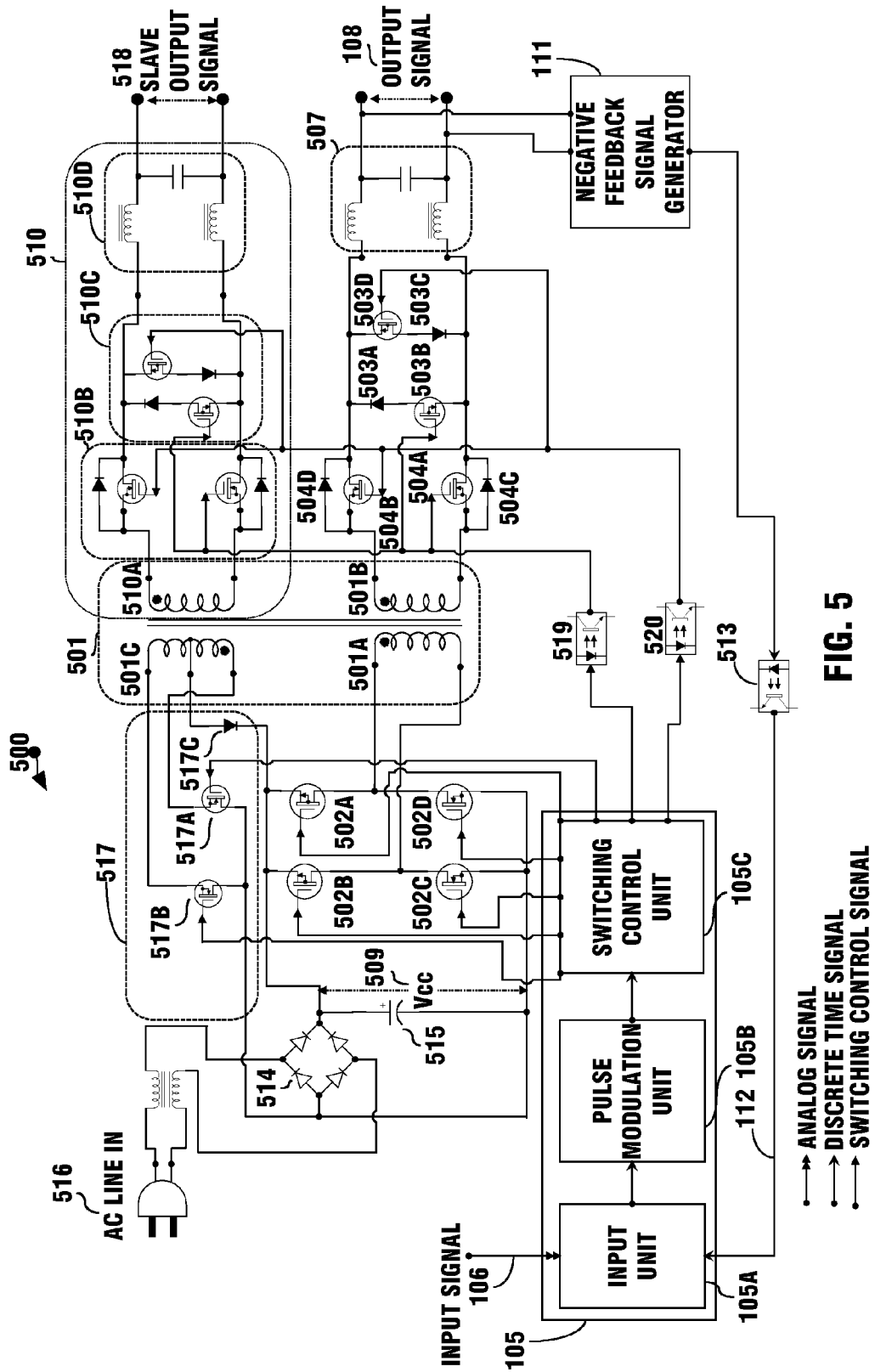
FIG. 5 is an exemplary block and circuit diagram illustrating a third embodiment of a switching amplifier in accordance with the present invention, wherein the first and second switching unit comprise a plurality of switches configured as a full bridge topology.

FIG. 5 is an exemplary block and circuit diagram illustrating a third embodiment of a switching amplifier 500 in accordance with the present invention, wherein the first and second switching unit comprise a plurality of switches 502A~502D configured as a full bridge topology.

As illustrated in FIG. 5, the switching amplifier 500 for obtaining an output signal 108 from a direct current (DC) voltage supply unit comprising a direct current (DC) voltage rail 509, wherein the output signal 108 is a linearly amplified replica of an input signal 106 having first and second polarities, said amplifier 500 comprising: a first switching unit comprising two switches 502A, 502C for switching a first pulsed voltage from the direct current (DC) voltage rail 409; a first switchable free-wheeling diode means unit comprising a free-wheeling diode means 503A and a switch 503B for providing a current path for transmitting energy from the first pulsed voltage to the output signal 108 during the switching off period of the first switching unit 502A, 502C; a second switching unit comprising two switches 502B, 502D for switching a second pulsed voltage from the direct current (DC) voltage rail 509; a second switchable free-wheeling diode means unit comprising a free-wheeling diode means 503C and a switch 503D for providing a current path for transmitting energy from the second pulsed voltage to the output signal 108 during the switching off period of the second switching unit 502B, 502D; a transformer 501 comprising a primary winding 501A coupled to the first switching unit 502A, 502C and the second switching unit 502B, 502D; a secondary winding unit comprising a secondary winding 501B and means comprising a reset winding 501C, two reset switching means 517A, 517B and one diode 517C for resetting the flux in the core of the transformer to its rest value by transforming the energy of parasitic inductance from the transformer 501 to the direct current (DC) voltage supply unit 509 during the switching off period of the first and second switching unit 502A, 502C and 502B, 502D, wherein the transformer 501 is for isolating the direct current (DC) voltage rail 509 and the output signal 108, and further for stepping up or down the first and second pulsed voltage; a switchable rectifier diode means unit comprising two switches 504A, 504B and two diodes 504C, 504D coupled between the secondary winding 501B and the first switchable free-wheeling diode means unit 503A, 503B, the second switchable free-wheeling diode means unit 503C, 503D for blocking energy transmitted from the secondary winding 501B to the output signal during the switching off period of the first and second switching unit 502A, 502C and 502B, 502D; an amplifier control unit 105 for receiving the input signal 106 and coupled to the switches 502A, 502B, 502C, 502D, 503B, 503D, 504A, 504B, 517A, 517B to control their switching according to the input signal 106; a filter unit 507 to obtain the output signal 108 corresponding to the input signal 106 by filtering the first pulsed voltage, the second pulsed voltage and outputting the output signal.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 5, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the switches 502A, 502B, 502C, 502D, 503B, 503D, 504A, 504B, 517A, 517B to control their switching according to the pulse modulated signal from the pulse modulation unit 105B.

In this non-limiting exemplary embodiment, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 5 and FIG. 2, a non-limiting exemplary waveform for the pulse modulated signal outputting from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switches 502A, 502C for controlling their switching is illustrated in FIG. 2(B); and a non-limiting exemplary waveform of switching control signals from the switching control unit 105C to the switches 502B, 502D for controlling their switching is illustrated in FIG. 2(C). Also according to the pulse modulated signal illustrated in FIG. 2(A), non-limiting exemplary waveforms of switching control signals from the switching control unit 105C to the switches 503B and 503D are illustrated in FIG. 2(D) and FIG. 2(E), respectively. Yet also according to the pulse modulated signal illustrated in FIG. 2(A), non-limiting exemplary waveforms of switching control signals from the switching control unit 105C to the switches 504A and 504B are illustrated in FIG. 2(F) and FIG. 2(G), respectively. Yet also according to the pulse modulated signal illustrated in FIG. 2(A), non-limiting exemplary waveforms of switching control signals from the switching control unit 105C to the switches 517A and 517B are illustrated in FIG. 2(H) and FIG. 2(I), respectively.

Accordingly, as illustrated in FIG. 5 and FIG. 2, when the input signal 106 is zero, the switches 502A, 502B, 502C, 502D, 503B, 503D, 504A, 504B, 517A, 517B are all switched off.

When the input signal 106 is not zero and its polarity is positive therefore the polarity of the pulse modulated signal FIG. 2(A) is positive, the first switching unit 502A, 502C switch a first pulsed voltage from the direct current (DC) voltage rail 509A according to the pulse modulated signal pulse modulated from the input signal 106, and the switch 503B of the first switchable free-wheeling diode means unit switches on to provide proper current path for a current flow through the inductor means of the filter 507 for keeping the energy transmission from the first pulsed voltage to the output signal 108 during the switching off period of the first switching unit 502A, 502C; and the switches 504A and 517A switch on for blocking a current flow in the secondary winding 501B to block energy transmitted from the secondary winding 501B to the output signal 108 during the switching off period of the first switching unit 502A, 502C and for resetting the flux in the core of the transformer 501 to its rest value by transforming the energy of parasitic inductance from the transformer 501 to the direct current (DC) voltage supply unit 509 during the switching off period of the first switching unit 502A, 502C.

When the input signal 106 is not zero and its polarity is negative therefore the polarity of the pulse modulated signal FIG. 2(A) is negative, the second switching unit 502B, 502D switches a second pulsed voltage from the direct current (DC) voltage rail 509A according to the pulse modulated signal pulse modulated from the input signal 106, and the switch 503D of the second switchable free-wheeling diode means unit switches on to provide proper current path for a current flow through the inductor means of the filter 507 for keeping the energy transmission from the second pulsed voltage to the output signal 108 during the switching off period of the second switching unit 502B, 502D; and the switches 504B and 517B switch on for blocking a current flow in the secondary winding 501B to block energy transmitted from the secondary winding 501B to the output signal 108 during the switching off period of the second switching unit 502B, 502D and for resetting the flux in the core of the transformer 501 to its rest value by transforming the energy of parasitic inductance from the transformer 501 to the direct current (DC) voltage supply unit 509 during the switching off period of the second switching unit 502B, 502D.

As further illustrated in FIG. 5, the filter unit 507 is a low pass filter to obtain the output signal 108 corresponding to the input signal 106 by filtering the first pulsed voltage, the second pulsed voltage and outputting the output signal 108.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 5, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n\leq\infty$$

to get a compensated discrete time input signal X[n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 500, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 5, the switching amplifier 500 further comprising one slave output unit 510 or more than one slave output units, although more than one slave output units are not shown in FIG. 5 but are obvious from said one slave output unit 510, wherein the slave output unit 510 comprises: the transformer 501 further comprising a slave secondary winding 510A; a switchable rectifier diode means unit 510B coupled to the slave secondary winding units for blocking energy transmitted from the slave secondary winding unit 510A to the slave output signal 518 during the switching off period of the first and second switching unit 502A, 502C and 502B, 502D; a first and second switchable free-wheeling diode means unit 510C for providing a current path for transmitting energy from the first and second pulsed voltage to the slave output signal 518 during the switching off period of the first and second switching unit 502A, 502C and 502B, 502D; a filter unit 510D to obtain the slave output signal 518 corresponding to the input signal 106 by filtering the pulsed voltage from the slave secondary winding unit 510A; wherein the amplifier control unit 105 further couples to the switches of slave output unit 510 to control their switching according to the input signal 105.

As further illustrated in FIG. 5, the amplifying gain of the output signal 108 is according to the turn ratio between the primary winding 501A and the secondary winding 501B; and the amplifying gain of the slave output signal 518 is according to the turn ratio between the primary winding 501A and the slave secondary winding 510A. Therefore, it is easy for the switching amplifier 500 to obtain a plurality of output signals with different amplifying gains.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 5, the amplifier control unit 105 of the switching amplifier 500 integrates the input signal 106 and the negative feedback signal 112 to process a negative feedback control. Accordingly, with the negative feedback control, the slave output signal 518 trends to track the output signal 108 for the direct current (DC) voltage 509 and load changes. Therefore, the switching amplifier 500 provides multiple output signals are substantially immune to power supply and load perturbations.

As further illustrated in FIG. 5, the switching amplifier 500 further comprises a photo coupler circuit 513 coupled between the negative feedback signal generator 111 and the amplifier control unit 105 to provide electric isolation between the negative feedback signal generator 111 and the amplifier control unit 105.

As further illustrated in FIG. 5, the switching amplifier 500 further comprises a photo coupler circuits 519, 520 coupled between the switchable free-wheeling diode means units, the switchable rectifier diode means units and the amplifier control unit 105 to provide electric isolation between the switchable free-wheeling diode means units, the switchable rectifier diode means units and the amplifier control unit.

As further illustrated in FIG. 5, the switching amplifier 500 further comprises a rectifying unit 514 and a smoothing unit 515 to rectify and smooth an alternating current (AC) voltage 516 and to provide the direct current (DC) voltage rail 509.

Figure 6:
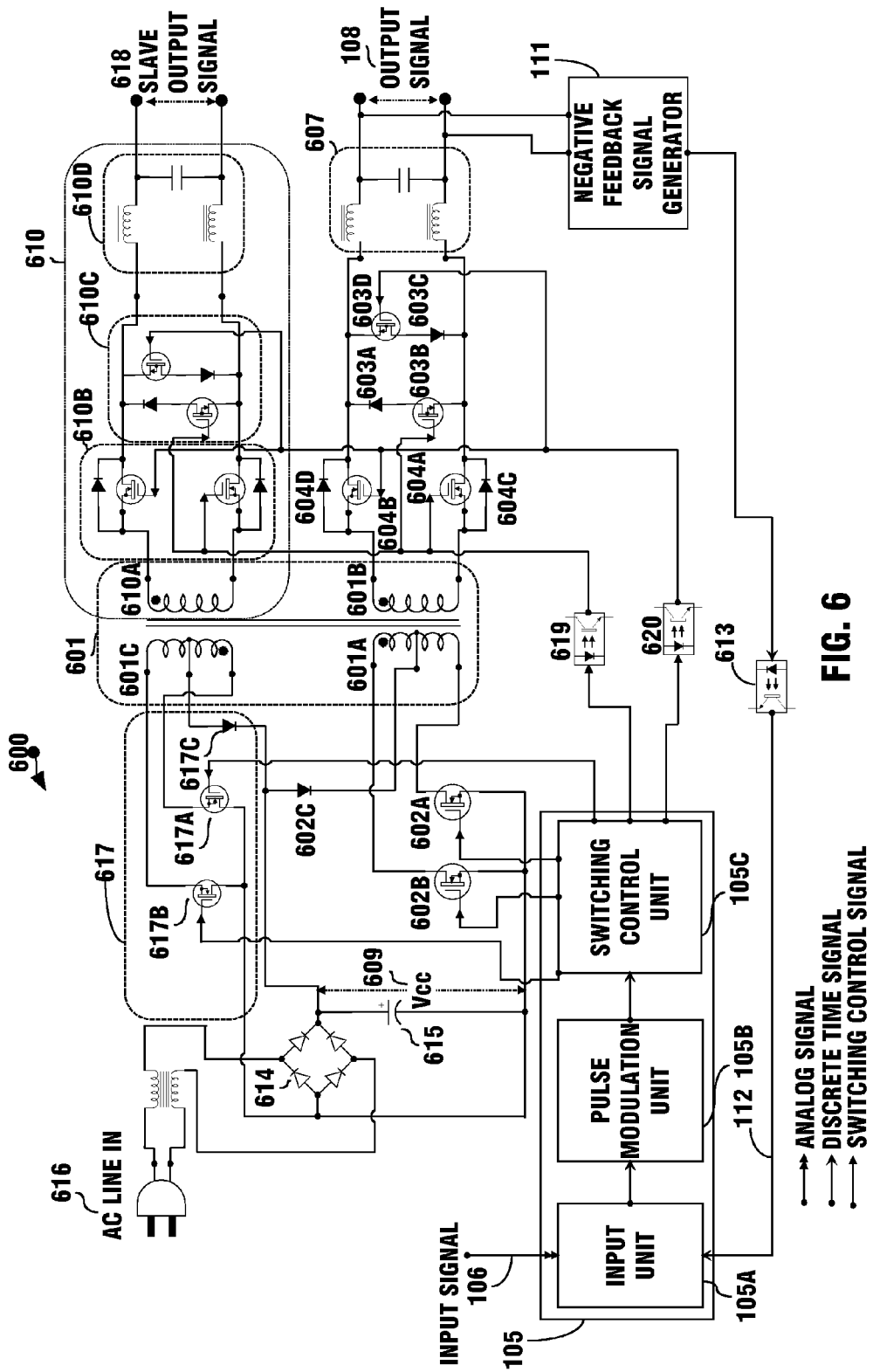
FIG. 6 is an exemplary block and circuit diagram illustrating a fourth embodiment of a switching amplifier in accordance with the present invention, wherein the first and second switching unit comprise a plurality of switches configured as a push pull topology.

FIG. 6 is an exemplary block and circuit diagram illustrating a fourth embodiment of a switching amplifier 600 in accordance with the present invention, wherein the first and second switching unit comprise a plurality of switches 602A, 602B configured as a push pull topology.

As illustrated in FIG. 6, the switching amplifier 600 for obtaining an output signal 108 from a direct current (DC) voltage supply unit comprising a direct current (DC) voltage rail 609, wherein the output signal 108 is a linearly amplified replica of an input signal 106 having first and second polarities, said amplifier 600 comprising: a first switching unit 602A comprising one switch for switching a first pulsed voltage from the direct current (DC) voltage rail 609; a first switchable free-wheeling diode means unit comprising a free-wheeling diode means 603A and a switch 603B for providing a current path for transmitting energy from the first pulsed voltage to the output signal 108 during the switching off period of the first switching unit 602A; a second switching unit 602B comprising one switch for switching a second pulsed voltage from the direct current (DC) voltage rail 609; a second switchable free-wheeling diode means unit comprising a free-wheeling diode means 603C and a switch 603D for providing a current path for transmitting energy from the second pulsed voltage to the output signal 108 during the switching off period of the second switching unit 602B; a transformer 601 comprising a primary winding 601A coupled to the first switching unit 602A and the second switching unit 602B; a secondary winding unit comprising a secondary winding 601B and means comprising a reset winding 601C, two reset switching means 617A, 617B and one diode 617C for resetting the flux in the core of the transformer to its rest value by transforming the energy of parasitic inductance from the transformer 601 to the direct current (DC) voltage supply unit 609 during the switching off period of the first and second switching unit 602A and 602B, wherein the transformer 601 is for isolating the direct current (DC) voltage rail 609 and the output signal 108, and further for stepping up or down the first and second pulsed voltage; a switchable rectifier diode means unit comprising two switches 604A, 604B and two diodes 604C, 604D coupled between the secondary winding 601B and the first switchable free-wheeling diode means unit 603A, 603B, the second switchable free-wheeling diode means unit 603C, 603D for blocking energy transmitted from the secondary winding 601B to the output signal 108 during the switching off period of the first and second switching unit 602A, 602B; an amplifier control unit 105 for receiving the input signal 106 and coupled to the switches 602A, 602B, 603B, 603D, 604A, 604B, 617A, 617B to control their switching according to the input signal 106; a filter unit 607 to obtain the output signal 108 corresponding to the input signal 106 by filtering the first pulsed voltage, the second pulsed voltage and outputting the output signal.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 6, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the switches 602A, 602B, 603B, 603D, 604A, 604B, 617A, 617B to control their switching according to the pulse modulated signal from the pulse modulation unit 105B.

In this non-limiting exemplary embodiment 600, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 6 and FIG. 2, a non-limiting exemplary waveform for the pulse modulated signal outputting from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signal from the switching control unit 105C to the switch 602A for controlling its switching is illustrated in FIG. 2(B); and a non-limiting exemplary waveform of switching control signal from the switching control unit 105C to the switch 602B for controlling its switching is illustrated in FIG. 2(C). Also according to the pulse modulated signal illustrated in FIG. 2(A), non-limiting exemplary waveforms of switching control signals from the switching control unit 105C to the switches 603B and 603D are illustrated in FIG. 2(D) and FIG. 2(E), respectively. Yet also according to the pulse modulated signal illustrated in FIG. 2(A), non-limiting exemplary waveforms of switching control signals from the switching control unit 105C to the switches 604A and 604B are illustrated in FIG. 2(F) and FIG. 2(G), respectively. Yet also according to the pulse modulated signal illustrated in FIG. 2(A), non-limiting exemplary waveforms of switching control signals from the switching control unit 105C to the switches 617A and 617B are illustrated in FIG. 2(H) and FIG. 2(I), respectively.

Accordingly, as illustrated in FIG. 6 and FIG. 2, when the input signal 106 is zero, the switches 602A, 602B, 603B, 603D, 604A, 604B, 617A, 617B are all switched off.

When the input signal 106 is not zero and its polarity is positive therefore the polarity of the pulse modulated signal FIG. 2(A) is positive, the first switching unit 602A switches a first pulsed voltage from the direct current (DC) voltage rail 609A according to the pulse modulated signal pulse modulated from the input signal 106, and the switch 603B of the first switchable free-wheeling diode means unit switches on to provide proper current path for a current flow through the inductor means of the filter 607 for keeping the energy transmission from the first pulsed voltage to the output signal 108 during the switching off period of the first switching unit 602A, and the switches 604A and 617A switch on for blocking a current flow in the secondary winding 601B to block energy transmitted from the secondary winding 601B to the output signal 108 during the switching off period of the first switching unit 602A and for resetting the flux in the core of the transformer 601 to its rest value by transforming the energy of parasitic inductance from the transformer 601 to the direct current (DC) voltage supply unit 609 during the switching off period of the first switching unit 602A.

When the input signal 106 is not zero and its polarity is negative therefore the polarity of the pulse modulated signal FIG. 2(A) is negative, the second switching unit 602B switches a second pulsed voltage from the direct current (DC) voltage rail 609A according to the pulse modulated signal pulse modulated from the input signal 106, and the switch 603D of the second switchable free-wheeling diode means unit switches on to provide proper current path for a current flow through the inductor means of the filter 607 for keeping the energy transmission from the second pulsed voltage to the output signal 108 during the switching off period of the second switching unit 602B, and the switches 604B and 617B switch on for blocking a current flow in the secondary winding 601B to block energy transmitted from the secondary winding 601B to the output signal 108 during the switching off period of the second switching unit 602B and for resetting the flux in the core of the transformer 601 to its rest value by transforming the energy of parasitic inductance from the transformer 601 to the direct current (DC) voltage supply unit 609 during the switching off period of the second switching unit 602B.

As further illustrated in FIG. 6, the filter unit 607 is a low pass filter to obtain the output signal 108 corresponding to the input signal 106 by filtering the first pulsed voltage, the second pulsed voltage and outputting the output signal 108.

As further illustrated in FIG. 6, the switching amplifier 600 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 6, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n\leq\infty$$

to get a compensated discrete time input signal X[n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 600, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 6, the switching amplifier 600 further comprising one slave output unit 610 or more than one slave output units, although more than one slave output units are not shown in FIG. 6 but are obvious from said one slave output unit 610, wherein the slave output unit 610 comprises: the transformer 601 further comprising a slave secondary winding 610A; a switchable rectifier diode means unit 610B coupled to the slave secondary winding units for blocking energy transmitted from the slave secondary winding unit 610A to the slave output signal 618 during the switching off period of the first and second switching unit 602A, 602B; a first and second switchable free-wheeling diode means unit 610C for providing a current path for transmitting energy from the first and second pulsed voltage to the slave output signal 618 during the switching off period of the first and second switching unit 602A, 602B; a filter unit 610D to obtain the slave output signal 618 corresponding to the input signal 106 by filtering the pulsed voltage from the slave secondary winding unit 610A; wherein the amplifier control unit 105 further couples to the switches of slave output unit 610 to control their switching according to the input signal 105.

As further illustrated in FIG. 6, the amplifying gain of the output signal 108 is according to the turn ratio between the primary winding 601A and the secondary winding 601B; and the amplifying gain of the slave output signal 618 is according to the turn ratio between the primary winding 601A and the slave secondary winding 610A. Therefore, it is easy for the switching amplifier 600 to obtain a plurality of output signals with different amplifying gains.

As further illustrated in FIG. 6, the switching amplifier 600 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 6, the amplifier control unit 105 of the switching amplifier 600 integrates the input signal 106 and the negative feedback signal 112 to process a negative feedback control. Accordingly, with the negative feedback control, the slave output signal 618 trends to track the output signal 108 for the direct current (DC) voltage 609 and load changes. Therefore, the switching amplifier 600 provides multiple output signals are substantially immune to power supply and load perturbations.

As further illustrated in FIG. 6, the switching amplifier 600 further comprises a photo coupler circuit 613 coupled between the negative feedback signal generator 111 and the amplifier control unit 105 to provide electric isolation between the negative feedback signal generator 111 and the amplifier control unit 105.

As further illustrated in FIG. 6, the switching amplifier 600 further comprises a photo coupler circuits 619, 620 coupled between the switchable free-wheeling diode means units, the switchable rectifier diode means units and the amplifier control unit 105 to provide electric isolation between the switchable free-wheeling diode means units, the switchable rectifier diode means units and the amplifier control unit 105.

As further illustrated in FIG. 6, the switching amplifier 600 further comprises a rectifying unit 614 and a smoothing unit 615 to rectify and smooth an alternating current (AC) voltage 616 and to provide the direct current (DC) voltage rail 609.

Figure 7:
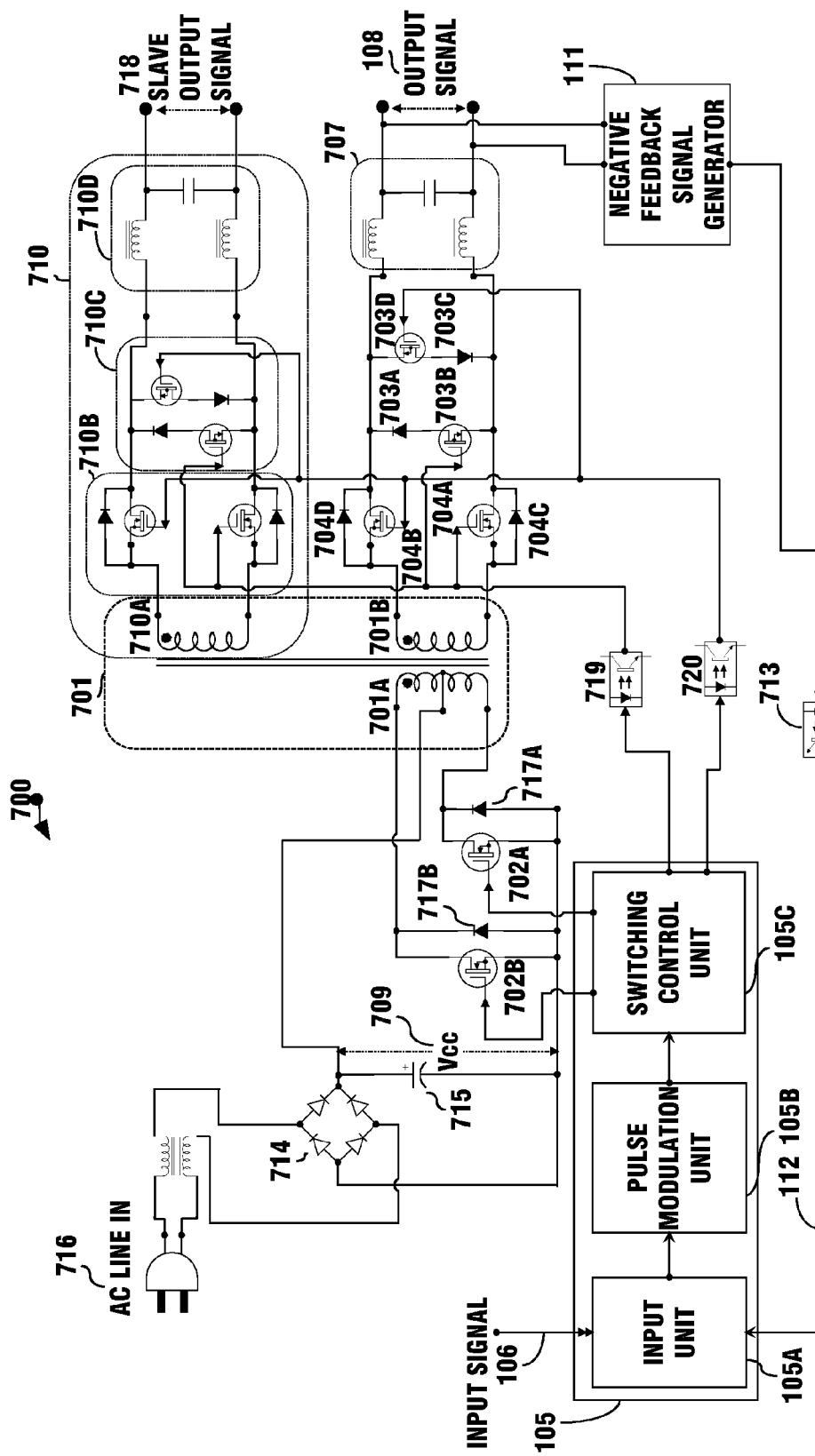
FIG. 7 is an exemplary block and circuit diagram illustrating a fifth embodiment of a switching amplifier in accordance with the present invention, wherein the primary winding and the reset winding is configured into a sole winding.

FIG. 7 is an exemplary block and circuit diagram illustrating a fifth embodiment of a switching amplifier 700 in accordance with the present invention, wherein the primary winding and the reset winding is configured into a sole winding 701A.

As illustrated in FIG. 7, the switching amplifier 700 for obtaining an output signal 108 from a direct current (DC) voltage supply unit comprising a direct current (DC) voltage rail 709, wherein the output signal 108 is a linearly amplified replica of an input signal 106 having first and second polarities, said amplifier 700 comprising: a first switching unit 702A comprising one switch for switching a first pulsed voltage from the direct current (DC) voltage rail 709; a first switchable free-wheeling diode means unit comprising a free-wheeling diode means 703A and a switch 703B for providing a current path for transmitting energy from the first pulsed voltage to the output signal 108 during the switching off period of the first switching unit 702A; a second switching unit 702B comprising one switch for switching a second pulsed voltage from the direct current (DC) voltage rail 709; a second switchable free-wheeling diode means unit comprising a free-wheeling diode means 703C and a switch 703D for providing a current path for transmitting energy from the second pulsed voltage to the output signal 108 during the switching off period of the second switching unit 702B; a transformer 701 comprising a primary winding 701A coupled to the first switching unit 702A and the second switching unit 702B; a secondary winding unit comprising a secondary winding 701B and means comprising two diode means 717A, 717B for resetting the flux in the core of the transformer to its rest value by transforming the energy of parasitic inductance from the transformer 701 to the direct current (DC) voltage supply unit 709 during the switching off period of the first and second switching unit 702A and 702B, wherein the transformer 701 is for isolating the direct current (DC) voltage rail 709 and the output signal 108, and further for stepping up or down the first and second pulsed voltage; a switchable rectifier diode means unit comprising two switches 704A, 704B and two diodes 704C, 704D coupled between the secondary winding 701B and the first switchable free-wheeling diode means unit 703A, 703B, the second switchable free-wheeling diode means unit 703C, 703D for blocking energy transmitted from the secondary winding 701B to the output signal 108 during the switching off period of the first and second switching unit 702A, 702B; an amplifier control unit 105 for receiving the input signal 106 and coupled to the switches 702A, 702B, 703B, 703D, 704A, 704B to control their switching according to the input signal 106; a filter unit 707 to obtain the output signal 108 corresponding to the input signal 106 by filtering the first pulsed voltage, the second pulsed voltage and outputting the output signal.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 7, the amplifier control unit 105 comprises an input unit 105A for receiving the input signal 106 and having an analog to digital converter for converting the input signal 106 to a discrete time input signal x[n]

$x=\{x[n]\}, 0<n<\infty;$ a pulse modulation unit 105B for getting a pulse modulated signal from pulse modulating the discrete time input signal x[n]; and a switching control unit 105C coupled to the switches 702A, 702B, 703B, 703D, 704A, 704B to control their switching according to the pulse modulated signal from the pulse modulation unit 105B.

In this non-limiting exemplary embodiment 700, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 7 and FIG. 2, a non-limiting exemplary waveform for the pulse modulated signal outputting from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signal from the switching control unit 105C to the switch 702A for controlling its switching is illustrated in FIG. 2(B); and a non-limiting exemplary waveform of switching control signal from the switching control unit 105C to the switch 702B for controlling its switching is illustrated in FIG. 2(C). Also according to the pulse modulated signal illustrated in FIG. 2(A), non-limiting exemplary waveforms of switching control signals from the switching control unit 105C to the switches 703B and 703D are illustrated in FIG. 2(D) and FIG. 2(E), respectively. Yet also according to the pulse modulated signal illustrated in FIG. 2(A), non-limiting exemplary waveforms of switching control signals from the switching control unit 105C to the switches 704A and 704B are illustrated in FIG. 2(F) and FIG. 2(G), respectively.

Accordingly, as illustrated in FIG. 7 and FIG. 2, when the input signal 106 is zero, the switches 702A, 702B, 703B, 703D, 704A, 704B are all switched off.

When the input signal 106 is not zero and its polarity is positive therefore the polarity of the pulse modulated signal FIG. 2(A) is positive, the first switching unit 702A switches a first pulsed voltage from the direct current (DC) voltage rail 709A according to the pulse modulated signal pulse modulated from the input signal 106, and the switch 703B of the first switchable free-wheeling diode means unit switches on to provide proper current path for a current flow through the inductor means of the filter 707 for keeping the energy transmission from the first pulsed voltage to the output signal 108 during the switching off period of the first switching unit 702A, and the switch 704A switches on for blocking a current flow in the secondary winding 701B to block energy transmitted from the secondary winding 701B to the output signal 108 during the switching off period of the first switching unit 702A and for resetting the flux in the core of the transformer 701 to its rest value by transforming the energy of parasitic inductance from the transformer 701 to the direct current (DC) voltage supply unit 709 during the switching off period of the first switching unit 702A.

When the input signal 106 is not zero and its polarity is negative therefore the polarity of the pulse modulated signal FIG. 2(A) is negative, the second switching unit 702B switches a second pulsed voltage from the direct current (DC) voltage rail 709A according to the pulse modulated signal pulse modulated from the input signal 106, and the switch 703D of the second switchable free-wheeling diode means unit switches on to provide proper current path for a current flow through the inductor means of the filter 707 for keeping the energy transmission from the second pulsed voltage to the output signal 108 during the switching off period of the second switching unit 702B, and the switch 704B switches on for blocking a current flow in the secondary winding 701B to block energy transmitted from the secondary winding 701B to the output signal 108 during the switching off period of the second switching unit 702B and for resetting the flux in the core of the transformer 701 to its rest value by transforming the energy of parasitic inductance from the transformer 701 to the direct current (DC) voltage supply unit 709 during the switching off period of the second switching unit 702B.

As further illustrated in FIG. 7, the filter unit 707 is a low pass filter to obtain the output signal 108 corresponding to the input signal 106 by filtering the first pulsed voltage, the second pulsed voltage and outputting the output signal 108.

As further illustrated in FIG. 7, the switching amplifier 700 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 7, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal $x[n]$ by multiplying a gain G to the discrete time input signal (the default value of the gain G is 1):

$$X[n]=\{G \times x[n]\}, 0<n \leqq \infty$$

to get a compensated discrete time input signal $X[n]$ and sends the compensated discrete time input signal $X[n]$ to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 700, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 7, the switching amplifier 700 further comprising one slave output unit 710 or more than one slave output units, although more than one slave output units are not shown in FIG. 7 but are obvious from said one slave output unit 710, wherein the slave output unit 710 comprises: the transformer 701 further comprising a slave secondary winding 710A; a switchable rectifier diode means unit 710B coupled to the slave secondary winding units for blocking energy transmitted from the slave secondary winding unit 710A to the slave output signal 718 during the switching off period of the first and second switching unit 702A, 702B; a first and second switchable free-wheeling diode means unit 710C for providing a current path for transmitting energy from the first and second pulsed voltage to the slave output signal 718 during the switching off period of the first and second switching unit 702A, 702B; a filter unit 710D to obtain the slave output signal 718 corresponding to the input signal 106 by filtering the pulsed voltage from the slave secondary winding unit 710A; wherein the amplifier control unit 105 further couples to the switches of slave output unit 710 to control their switching according to the input signal 105.

As further illustrated in FIG. 7, the amplifying gain of the output signal 108 is according to the turn ratio between the primary winding 701A and the secondary winding 701B; and the amplifying gain of the slave output signal 718 is according to the turn ratio between the primary winding 701A and the slave secondary winding 710A. Therefore, it is easy for the switching amplifier 700 to obtain a plurality of output signals with different amplifying gains.

As further illustrated in FIG. 7, the switching amplifier 700 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 7, the amplifier control unit 105 of the switching amplifier 700 integrates the input signal 106 and the negative feedback signal 112 to process a negative feedback control. Accordingly, with the negative feedback control, the slave output signal 718 trends to track the output signal 108 for the direct current (DC) voltage 709 and load changes. Therefore, the switching amplifier 700 provides multiple output signals are substantially immune to power supply and load perturbations.

As further illustrated in FIG. 7, the switching amplifier 700 further comprises a photo coupler circuit 713 coupled between the negative feedback signal generator 111 and the amplifier control unit 105 to provide electric isolation between the negative feedback signal generator 111 and the amplifier control unit 105.

As further illustrated in FIG. 7, the switching amplifier 700 further comprises a photo coupler circuits 719, 720 coupled between the switchable free-wheeling diode means units, the switchable rectifier diode means units and the amplifier control unit 105 to provide electric isolation between the switchable free-wheeling diode means units, the switchable rectifier diode means units and the amplifier control unit 105.

As further illustrated in FIG. 7, the switching amplifier 700 further comprises a rectifying unit 714 and a smoothing unit 715 to rectify and smooth an alternating current (AC) voltage 716 and to provide the direct current (DC) voltage rail 709.

Therefore, the switching amplifier 700 is a simplified version of the switching amplifier 600 in FIG. 6: if the turn ratio between the primary winding and the reset winding is 1:1, then the switching amplifier 600 can further be simplified to a switching amplifier 700. The turn ratio is determined by a proper design, since the speed of resetting the flux in the core of the transformer is determined by the turn ratio between a primary winding and a reset winding. If a reset winding has less turns, the speed to reset the flux in the core of the transformer would be faster.

Figure 8:
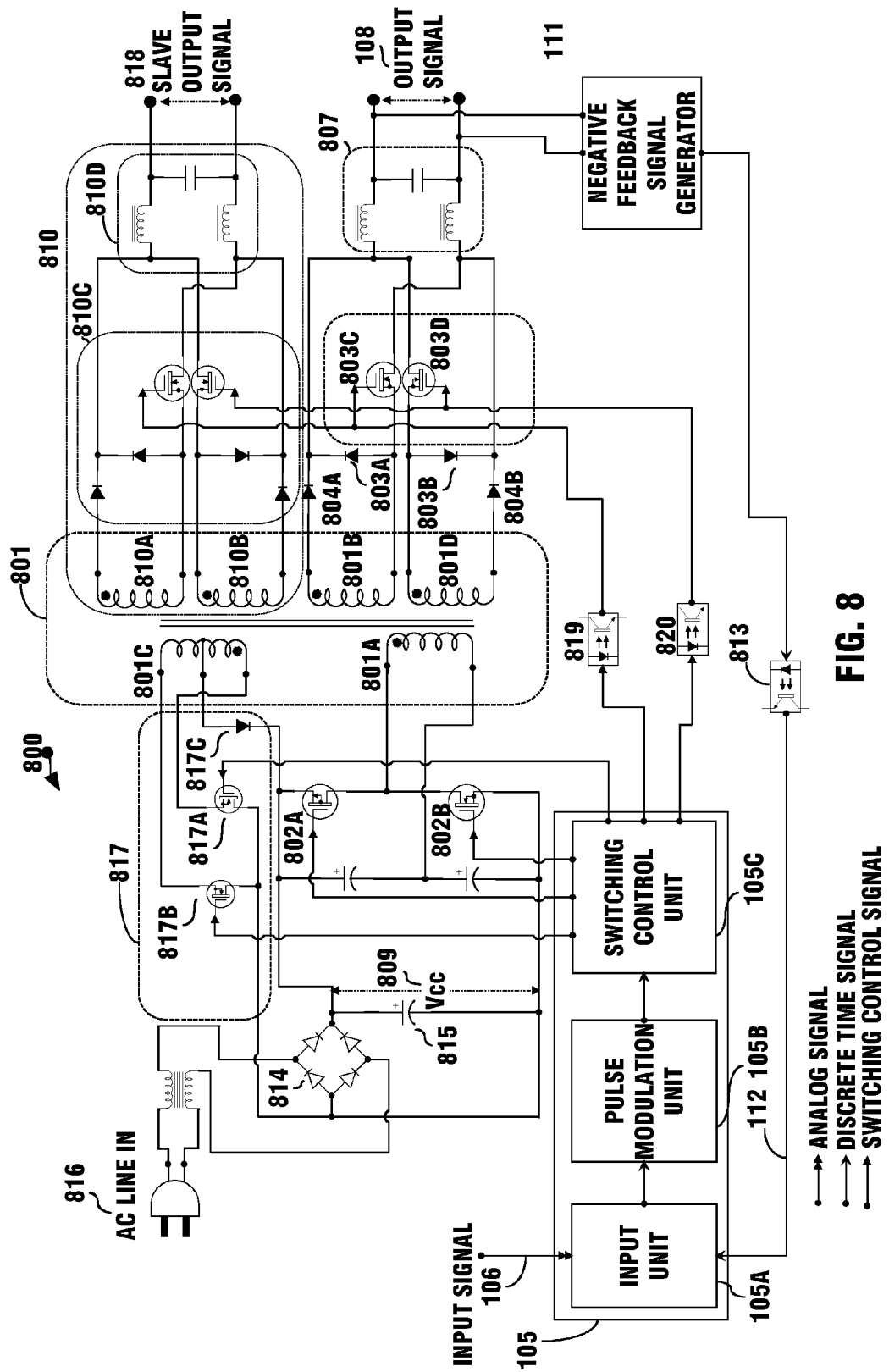
FIG. 8 is an exemplary block and circuit diagram illustrating a sixth embodiment of a switching amplifier in accordance with the present invention, wherein the secondary winding unit comprises two secondary windings.

FIG. 8 is an exemplary block and circuit diagram illustrating a sixth embodiment of a switching amplifier 800 in accordance with the present invention, wherein the secondary winding unit comprises two secondary windings 801B, 801D.

As illustrated in FIG. 8, the switching amplifier 800 for obtaining an output signal 108 from a direct current (DC) voltage supply unit comprising a direct current (DC) voltage rail 809, wherein the output signal 108 is a linearly amplified replica of an input signal 106 having first and second polarities, said amplifier 800 comprising: a first switching unit 802A comprising one switch for switching a first pulsed voltage from the direct current (DC) voltage rail 809; a first switchable free-wheeling diode means unit comprising a free-wheeling diode means 803A and a switch 803C for providing a current path for transmitting energy from the first pulsed voltage to the output signal 108 during the switching off period of the first switching unit 802A; a second switching unit 802B comprising one switch for switching a second pulsed voltage from the direct current (DC) voltage rail 809; a second switchable free-wheeling diode means unit comprising a free-wheeling diode means 803B and a switch 803D for providing a current path for transmitting energy from the second pulsed voltage to the output signal 108 during the switching off period of the second switching unit 802B; a transformer 801 comprising a primary winding 801A coupled to the first switching unit 802A and the second switching unit 802B; a secondary winding unit comprising two secondary windings 801B, 801D and means comprising a reset winding 801C, two reset switching means 817A, 817B and one diode 817C for resetting the flux in the core of the transformer to its rest value by transforming the energy of parasitic inductance from the transformer 801 to the direct current (DC) voltage supply unit 809 during the switching off period of the first and second switching unit 802A and 802B, wherein the transformer 801 is for isolating the direct current (DC) voltage rail 809 and the output signal 108, and further for stepping up or down the first and second pulsed voltage; a switchable rectifier diode means unit comprising two diodes 804A, 804B coupled between the secondary windings 801B, 801D and the first switchable free-wheeling diode means unit 803A the second switchable free-wheeling diode means unit 803B for blocking energy transmitted from the secondary windings 801B, 801D to the output signal during the switching off period of the first and second switching unit 802A, 802B, wherein the switches 803C, 803D are also used for switching on/off the switchable rectifier diode means unit 804A, 804B; an amplifier control unit 105 for receiving the input signal 106 and coupled to the switches 802A, 802B, 803C, 803D, 817A, 817B to control their switching according to the input signal 106; a filter unit 807 to obtain the output signal 108 corresponding to the input signal 106 by filtering the first pulsed voltage, the second pulsed voltage and outputting the output signal.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 8, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the switches 802A, 802B, 803C, 803D, 817A, 817B to control their switching according to the pulse modulated signal from the pulse modulation unit 105B.

In this non-limiting exemplary embodiment 800, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 8 and FIG. 2, a non-limiting exemplary waveform for the pulse modulated signal outputting from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signal from the switching control unit 105C to the switch 802A for controlling its switching is illustrated in FIG. 2(B); and a non-limiting exemplary waveform of switching control signal from the switching control unit 105C to the switch 802B for controlling its switching is illustrated in FIG. 2(C). Also according to the pulse modulated signal illustrated in FIG. 2(A), non-limiting exemplary waveforms of switching control signals from the switching control unit 105C to the switches 803C and 803D are illustrated in FIG. 2(D) and FIG. 2(E), respectively. Yet also according to the pulse modulated signal illustrated in FIG. 2(A), non-limiting exemplary waveforms of switching control signals from the switching control unit 105C to the switches 817A and 817B are illustrated in FIG. 2(H) and FIG. 2(I), respectively.

Accordingly, as illustrated in FIG. 8 and FIG. 2, when the input signal 106 is zero, the switches 802A, 802B, 803C, 803D, 817A, 817B are all switched off.

When the input signal 106 is not zero and its polarity is positive therefore the polarity of the pulse modulated signal FIG. 2(A) is positive, the first switching unit 802A switches a first pulsed voltage from the direct current (DC) voltage rail 809A according to the pulse modulated signal pulse modulated from the input signal 106, and the switch 803C switches on to provide proper current path for a current flow through the inductor means of the filter 807 for keeping the energy transmission from the first pulsed voltage to the output signal 108 during the switching off period of the first switching unit 802A, and for blocking a current flow in the secondary winding 801B to block energy transmitted from the secondary winding 801B to the output signal 108 during the switching off period of the first switching unit 802A and the switch 817A switches on for resetting the flux in the core of the transformer 801 to its rest value by transforming the energy of parasitic inductance from the transformer 801 to the direct current (DC) voltage supply unit 809 during the switching off period of the first switching unit 802A.

When the input signal 106 is not zero and its polarity is negative therefore the polarity of the pulse modulated signal FIG. 2(A) is negative, the second switching unit 802B switches a second pulsed voltage from the direct current (DC) voltage rail 809A according to the pulse modulated signal pulse modulated from the input signal 106, and the switch 803D switches on to provide proper current path for a current flow through the inductor means of the filter 807 for keeping the energy transmission from the second pulsed voltage to the output signal 108 during the switching off period of the second switching unit 802B, and for blocking a current flow in the secondary winding 801B to block energy transmitted from the secondary winding 801B to the output signal 108 during the switching off period of the second switching unit 802B and the switch 817B switches on for resetting the flux in the core of the transformer 801 to its rest value by transforming the energy of parasitic inductance from the transformer 801 to the direct current (DC) voltage supply unit 809 during the switching off period of the second switching unit 802B.

As further illustrated in FIG. 8, the filter unit 807 is a low pass filter to obtain the output signal 108 corresponding to the input signal 106 by filtering the first pulsed voltage, the second pulsed voltage and outputting the output signal 108.

As further illustrated in FIG. 8, the switching amplifier 800 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4, 5, 6, 7 and 8 in accordance with the present invention.

As illustrated in FIG. 3 and FIG. 8, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n \leq \infty$$

to get a compensated discrete time input signal X[n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 800, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 8, the switching amplifier 800 further comprising one slave output unit 810 or more than one slave output units, although more than one slave output units are not shown in FIG. 8 but are obvious from said one slave output unit 810, wherein the slave output unit 810 comprises: the transformer 801 further comprising two slave secondary windings 810A, 810B; a switchable rectifier diode means unit and first and second switchable free-wheeling diode means unit 810C coupled to the slave secondary winding units for blocking energy transmitted from the slave secondary winding unit 810A, 810B to the slave output signal 818 and for providing a current path for transmitting energy from the first and second pulsed voltage to the slave output signal 818 during the switching off period of the first and second switching unit 802A, 802B; a filter unit 810D to obtain the slave output signal 818 corresponding to the input signal 106 by filtering the pulsed voltage from the slave secondary winding unit 810A, 810B; wherein the amplifier control unit 105 further couples to the switches of slave output unit 810 to control their switching according to the input signal 105.

As further illustrated in FIG. 8, the amplifying gain of the output signal 108 is according to the turn ratio between the primary winding 801A and the secondary windings 801B, 801D; and the amplifying gain of the slave output signal 818 is according to the turn ratio between the primary winding 801A and the slave secondary windings 810A, 810B. Therefore, it is easy for the switching amplifier 800 to obtain a plurality of output signals with different amplifying gains.

As further illustrated in FIG. 8, the switching amplifier 800 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 8, the amplifier control unit 105 of the switching amplifier 800 integrates the input signal 106 and the negative feedback signal 112 to process a negative feedback control. Accordingly, with the negative feedback control, the slave output signal 818 trends to track the output signal 108 for the direct current (DC) voltage 809 and load changes. Therefore, the switching amplifier 800 provides multiple output signals are substantially immune to power supply and load perturbations.

As further illustrated in FIG. 8, the switching amplifier 800 further comprises a photo coupler circuit 813 coupled between the negative feedback signal generator 111 and the amplifier control unit 105 to provide electric isolation between the negative feedback signal generator 111 and the amplifier control unit 105.

As further illustrated in FIG. 8, the switching amplifier 800 further comprises a photo coupler circuits 819, 820 coupled between the switchable free-wheeling diode means units, the switchable rectifier diode means units and the amplifier control unit 105 to provide electric isolation between the switchable free-wheeling diode means units, the switchable rectifier diode means units and the amplifier control unit.

As further illustrated in FIG. 8, the switching amplifier 800 further comprises a rectifying unit 814 and a smoothing unit 815 to rectify and smooth an alternating current (AC) voltage 816 and to provide the direct current (DC) voltage rail 809.

From the switching amplifiers 100, 400, 500, 600, 700 and 800 in accordance with the present invention, one aspect of the present invention provides a switching amplifier that is highly efficient and without the "dead time" problem related to the class D amplifiers. Accordingly, the switches of the switching amplifiers 100, 400, 500, 600, 700 and 800 are never short the direct current (DC) voltage through themselves.

From the switching amplifiers 100, 400, 500, 600, 700 and 800 in accordance with the present invention, another aspect of the present invention provides a switching amplifier that is completely off when there is no input signal, as illustrated in FIG. 2.

From the switching amplifiers 400, 500, 600, 700 and 800 in accordance with the present invention, yet another aspect of the present invention provides a switching amplifier for obtaining a plurality of different linearly amplified replicas of the input signal, and adding more outputs easily and economically.

From the switching amplifiers 400, 500, 600, 700 and 800 in accordance with the present invention, yet another aspect of the present invention provides a switching amplifier that isolates the outputs from the power supply, as illustrated in FIGS. 4, 5, 6, 7 and 8.

From the switching amplifiers 100, 400, 500, 600, 700 and 800 in accordance with the present invention, yet another aspect of the present invention provides a switching amplifier which comprised of an act of comparing an input signal with an output feedback signal for detection and correction of overall system signal processes therefore does not require a power supply regulator and is substantially immune to power supply and load perturbations, as illustrated in FIGS. 1, 3, 4, 5, 6, 7 and 8.

From the switching amplifiers 400, 500, 600, 700 and 800 in accordance with the present invention, yet another aspect of the present invention provides a switching amplifier with the negative feedback control that the slave output signals trends to track the output signal for the direct current (DC) voltage and load changes for obtaining multiple output signals are substantially immune to power supply and load perturbations.

It is to be understood that the above described embodiments are merely illustrative of the principles of the invention and that other arrangements may be devised by those skilled in the art without departing from the spirit and scope of the invention.

What is claimed is:

1. A method of obtaining an output signal which is a linearly amplified replica of an input signal having first and second polarities, comprising the steps of:
   receiving the input signal;
   pulse modulating the input signal for getting a pulse modulated signal;
   switching a first switching unit for getting a first pulsed voltage from a direct current (DC) voltage supply unit according to the pulse modulated signal when the polarity of the input signal is positive;
   keeping the energy transmission from the first pulsed voltage to the output signal during the switching off period of the first switching unit via switching on a first switchable free-wheeling diode means unit coupled to the first switching unit and using the first switchable free-wheeling diode means unit to provide a proper current path for the energy transmission when the polarity of the input signal is positive;
   switching a second switching unit for getting a second pulsed voltage from the direct current (DC) voltage supply unit according to the pulse modulated signal when the polarity of the input signal is negative;
   keeping the energy transmission from the second pulsed voltage to the output signal during the switching off period of the second switching unit via switching on a second switchable free-wheeling diode means unit coupled to the second switching unit and using the second switchable free-wheeling diode means unit to provide a proper current path for the energy transmission when the polarity of the input signal is negative;
   filtering the first pulsed voltage, the second pulsed voltage for outputting the output signal.

2. The method according to claim 1, wherein the direct current (DC) voltage supply unit comprises a positive direct current (DC) voltage rail and a negative direct current (DC) voltage rail.

3. The method of claim 1 further comprising:
   isolating the direct current (DC) voltage supply unit and the output signal via a transformer and a switchable rectifier diode means unit coupled between the first switching unit, the second switching unit and the first switchable free-wheeling diode means unit, the second switchable free-wheeling diode means unit, wherein the transformer comprises a primary winding, a secondary winding unit comprising a secondary winding or two secondary windings, and a reset winding or using the primary winding resetting the flux in the core of the transformer to its rest value by transforming the energy of parasitic inductance from the transformer to the direct current (DC) voltage supply unit during the switching off period of the first switching unit, the second switching unit, wherein the switchable rectifier diode means unit blocks current flow in the secondary winding unit during the switching off period of the first switching unit, the second switching unit, wherein the direct current (DC) voltage supply unit comprises a positive direct current (DC) voltage rail.

4. The method of claim 3 further comprising:
stepping up or down the pulsed voltage through the transformer.

5. The method of claim 1 further comprising:
getting a feedback signal by detecting the output signal and integrating the feedback signal to process a negative feedback control.

6. The method of claim 3 further comprising:
getting one or more than one slave output signals that are linearly amplified replicas of the input signal using corresponding slave secondary winding units of the transformer, wherein the transformer further comprises one or more than one slave secondary winding units and each slave secondary winding unit comprising a secondary winding or two secondary windings is for generating a corresponding slave output signal.

7. A switching amplifier for obtaining an output signal from a direct current (DC) voltage supply unit, wherein the output signal is a linearly amplified replica of an input signal having first and second polarities, said amplifier comprising:
a first switching unit comprising at least one switch for switching a first pulsed voltage from the direct current (DC) voltage supply unit;
a first switchable free-wheeling diode means unit coupled to the first switching unit, wherein the first switchable free-wheeling diode means unit comprises at least one free-wheeling diode means or further comprises at least one switch for providing a current path for transmitting energy from the first pulsed voltage to the output signal during the switching off period of the first switching unit;
a second switching unit comprising at least one switch for switching a second pulsed voltage from the direct current (DC) voltage supply unit;
a second switchable free-wheeling diode means unit coupled to the second switching unit, wherein the second switchable free-wheeling diode means unit comprises at least one free-wheeling diode means or further comprises at least one switch for providing a current path for transmitting energy from the second pulsed voltage to the output signal during the switching off period of the second switching unit;
an amplifier control unit for receiving the input signal and coupled to the switches of the first switching unit, the second switching unit, the first switchable free-wheeling diode means unit and the second switchable free-wheeling diode means unit to control their switching according to the input signal;
a filter unit to obtain the output signal corresponding to the input signal by filtering the first pulsed voltage, the second pulsed voltage and outputting the output signal.

8. The switching amplifier according to claim 7, wherein the direct current (DC) voltage supply unit comprises a positive direct current (DC) voltage rail and a negative direct current (DC) voltage rail.

9. The switching amplifier according to claim 7, further comprising:
a transformer comprising a primary winding coupled to the first switching unit and the second switching unit; a secondary winding unit comprising a secondary winding or two secondary windings and a reset winding or using the primary winding for resetting the flux in the core of the transformer to its rest value by transforming the energy of parasitic inductance from the transformer to the direct current (DC) voltage supply unit during the switching off period of the first and second switching unit, wherein the transformer is for isolating the direct current (DC) voltage supply unit and the output signal, or further for stepping up or down the first and second pulsed voltage;
a switchable rectifier diode means unit coupled between the secondary winding unit and the first switchable free-wheeling diode means unit, the second switchable free-wheeling diode means unit for blocking energy transmitted from the secondary winding unit to the output signal during the switching off period of the first and second switching unit, wherein the switchable rectifier diode means unit comprises at least two rectifier diode means or further comprises at least two switches;
wherein the direct current (DC) voltage supply unit comprises a direct current (DC) voltage rail, and the amplifier control unit further couples to switches for switching the switchable rectifier diode means unit to control their switching according to the input signal.

10. The switching amplifier according to claim 9, further comprising:
a rectifying and smoothing unit to rectify and smooth an alternating current (AC) voltage and to provide the direct current (DC) voltage rail.

11. The switching amplifier according to claim 7, further comprising:
a negative feedback signal generator to generate a negative feedback signal corresponding to the output signal,
wherein the amplifier control unit integrates the input signal and the negative feedback signal to process a negative feedback control.

12. The switching amplifier according to claim 11, further comprising:
an isolator circuit coupled between the negative feedback signal generator and the amplifier control unit to provide electric isolation between the negative feedback signal generator and the amplifier control unit.

13. The switching amplifier according to claim 9, further comprising:
one or more than one slave output units that each one for obtaining a corresponding slave output signal comprises:
a slave secondary winding unit of the transformer, wherein the transformer further comprising the slave secondary winding unit comprising one or two secondary windings, that each slave secondary winding unit is;
a switchable rectifier diode means unit coupled to the slave secondary winding units for blocking energy transmitted from the slave secondary winding unit to the slave output signal during the switching off period of the first and second switching unit;
a first and second switchable free-wheeling diode means unit for providing a current path for transmitting energy from the first and second pulsed voltage to the slave output signal during the switching off period of the first and second switching unit;

a filter unit to obtain the slave output signal corresponding to the input signal by filtering the pulsed voltage from the slave secondary winding unit;

wherein the amplifier control unit further couples to the switches of slave output unit to control their switching according to the input signal.

14. The switching amplifier according to claim 7, further comprising:

isolator circuits coupled between the first switching unit, the second switching unit and the amplifier control unit to provide electric isolation between the first switching unit, the second switching unit and the amplifier control unit.

15. The switching amplifier according to claim 7, further comprising:

isolator circuits coupled between first switchable free-wheeling diode means unit, the second switchable free-wheeling diode means unit and the amplifier control unit to provide electric isolation between the first switchable free-wheeling diode means unit, the second switchable free-wheeling diode means unit and the amplifier control unit.

16. The switching amplifier according to claim 9, further comprising:

isolator circuits coupled between the switchable rectifier diode means unit and the amplifier control unit to provide electric isolation between the switchable rectifier diode means unit and the amplifier control unit.

17. The switching amplifier according to claim 13, further comprising:

isolator circuits coupled between the slave output units corresponding to slave output signals and the amplifier control unit to provide electric isolation between the slave output units and the amplifier control unit.

18. The switching amplifier according to claim 9, wherein the first and second switching units comprises a plurality of switches configured as a half bridge topology, a full bridge topology, or a push pull topology.

19. The switching amplifier according to claim 7, wherein the input signal is an analog signal or a discrete time signal.

20. The switching amplifier according to claim 7, wherein the filter unit is a low pass filter or a band pass filter or a band stop filter.

* * * * *